MODULE TECHNIQUE

Filed Dec. 28, 1962 2 Sheets-Sheet 1

Inventors:
Boubene M. Jaremus
Temple Nieter and
Charles E. Rufer
By: [attorney's signature] Atty.

April 26, 1966 B. M. JAREMUS ETAL 3,247,578

MODULE TECHNIQUE

Filed Dec. 28, 1962 2 Sheets-Sheet 2

Inventors:
Boubene M. Jaremus
Temple Nieter and
Charles E. Rufer
By: F. A. Kruzemark Atty.

United States Patent Office 3,247,578

Patented Apr. 26, 1966

3,247,578

MODULE TECHNIQUE

Boubene M. Jaremus, Barrington, Temple Nieter, Evanston, and Charles E. Rufer, Park Ridge, Ill., assignors to Borg-Warner Corporation, Chicago, Ill., a corporation of Illinois Filed Dec. 28, 1962, Ser. No. 248,033
2 Claims. (Cl. 29—155.5)

The present invention relates to a method of making thermoelectric assemblies for heat pumps and, more particularly, to the fabrication of thermoelectric interfaces and their attachment to the bus bars of a thermoelectric module.

In the manufacture of thermoelectric assemblies, problems arise with respect to selection of materials and the manner in which the various components are to be assembled in order to secure the greatest possible performance.

The technique employed in the present invention involves the use of aluminum oxide, a material not normally used at low temperatures for heat transfer and not normally used in thermoelectric devices.

It is therefore an important object of the present invention to provide an improved thermoelectric module assembly wherein the interfaces have exceptionally good dielectric properties and exceptionally good thermal conductivity.

It is another important object of the present invention to provide an improved high performance thermoelectric module that is economical to manufacture.

The present invention consists of the novel methods, constructions, arrangements and devices to be hereinafter described and claimed for carrying out the above stated objects and such other objects as will be apparent from the following description of a preferred manner of exercising the invention, illustrated with reference to the accompanying drawings, wherein:

Like characters of reference designate like parts in the several views.

Figures 1, 2, 3:
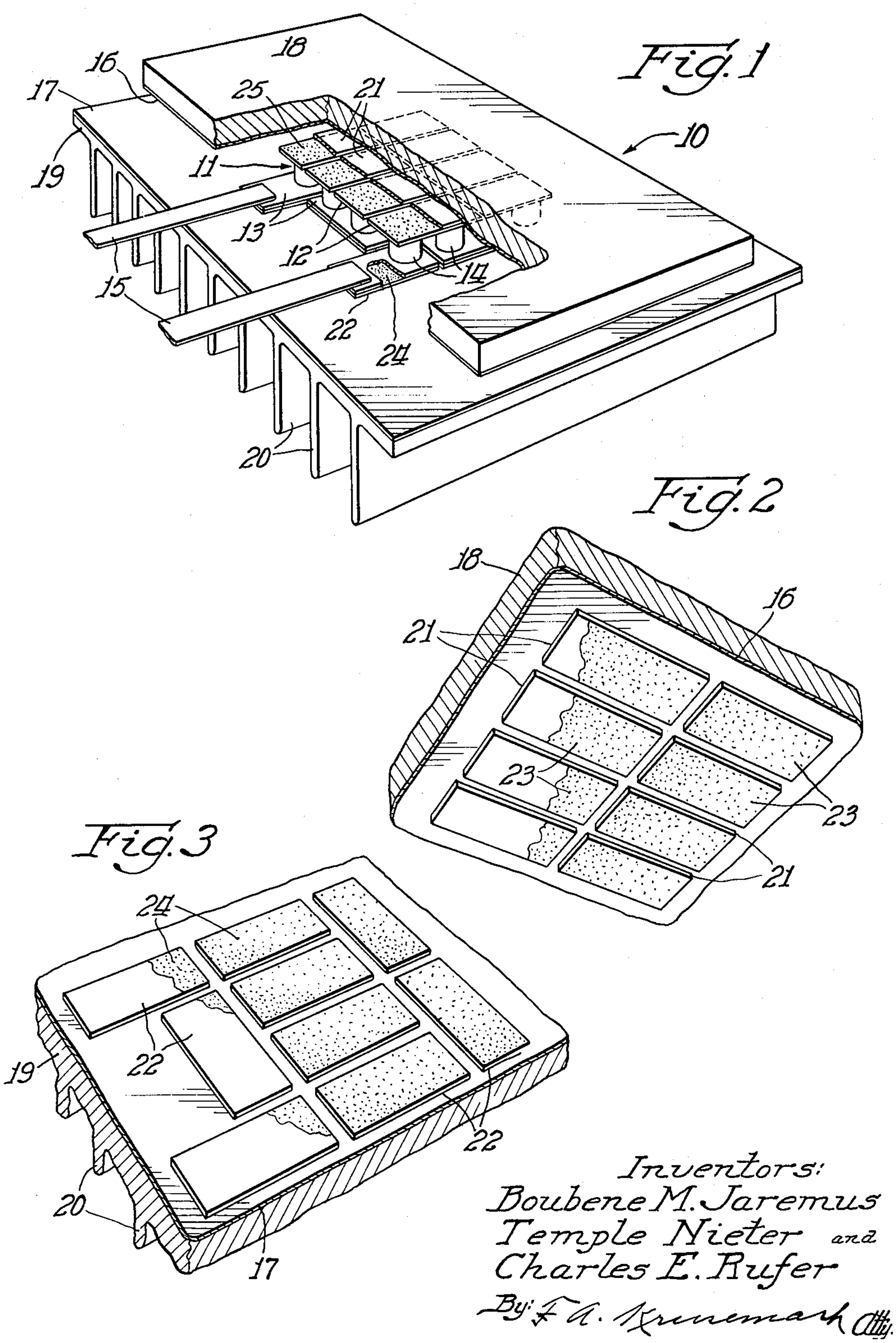
FIGURE 1 is a perspective view, partially broken away, of a heat pump assembly according to the present invention.
FIGURE 2 is a perspective view of the aluminum substrate according to the present invention covered with a thermal conductive dielectric film of aluminum oxide having a film of solderable metal thereon in the form of a circuit pattern connectable to the cold side or cold junction of a thermoelectric module.
FIGURE 3 is a perspective view of the aluminum substrate provided with fins covered with a thermal conductive dielectric film of aluminum oxide having a film of solderable metal thereon in the form of a circuit pattern connectable to the hot side or hot junction of a thermoelectric module according to the present invention.

Referring now to FIGURE 1, the heat pump 10 is shown having a thermoelectric module 11 comprising bus bars 12 and 13 constituting cold and hot junctions, respectively, interconnected by thermoelectric elements 14. Electrical leads 15 are connected to the hot junctions. Aluminum oxide films 16 and 17 are flame sprayed on the inner faces of substrata or base plates 18 and 19 respectively, the latter being provided with fins 20. Copper circuit patterns 21 and 22 are flame sprayed on the aluminum oxide films 16 and 17, respectively, in a pattern to match the patterns of the bus bars 12 and 13, respectively. Solder films 23 and 24, and 25 and 26, are tinned on the copper circuit patterns 21 and 22, respectively, and the faces of the bus bars 12 and 13, respectively.

A further delineation of the components of the heat pump 10 is shown in FIGURES 2, 3, 6 and 7. The substrata or base plates 18 and 19 in FIGURES 2 and 3, respectively, are partially shown.

In the present invention a thermoelectric module is prepared in accordance with one of the currently established practices.

In order to utilize the module as a heat pump it is necessary to provide heat exchangers, commonly referred to as substrata or base plates, connected to the hot and cold sides. This calls for the use of a thermal conductive dielectric material, usually referred to as an interface, connected between the hot and cold junctions and their respective heat exchangers.

In the present invention this material is an aluminum oxide film 16 and 17, flame sprayed on the substrata 18 and 19, respectively. The steps with respect to assembling the aluminum oxide interface between the hot and cold junctions and their respective base plates, or substrates, are the same and, therefore, in the interest of brevity steps with respect to one only will be given, namely, the cold side.

Figure 4:
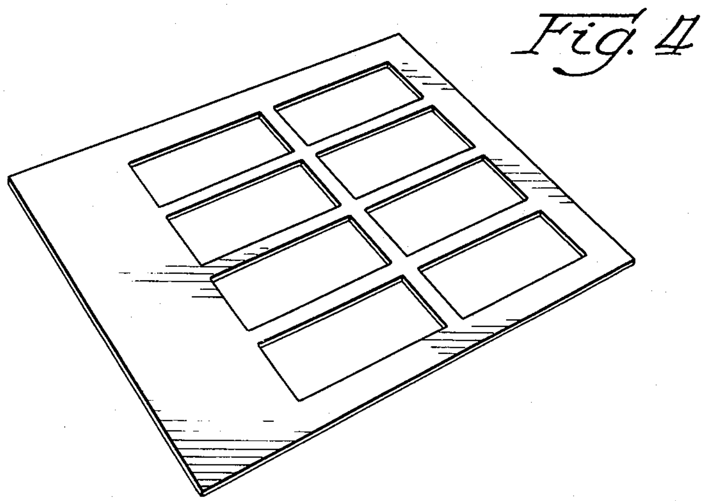
FIGURE 4 is a perspective view of a metallic stencil for use in spraying the circuit pattern shown in FIGURE 2.
Figures 5, 6:
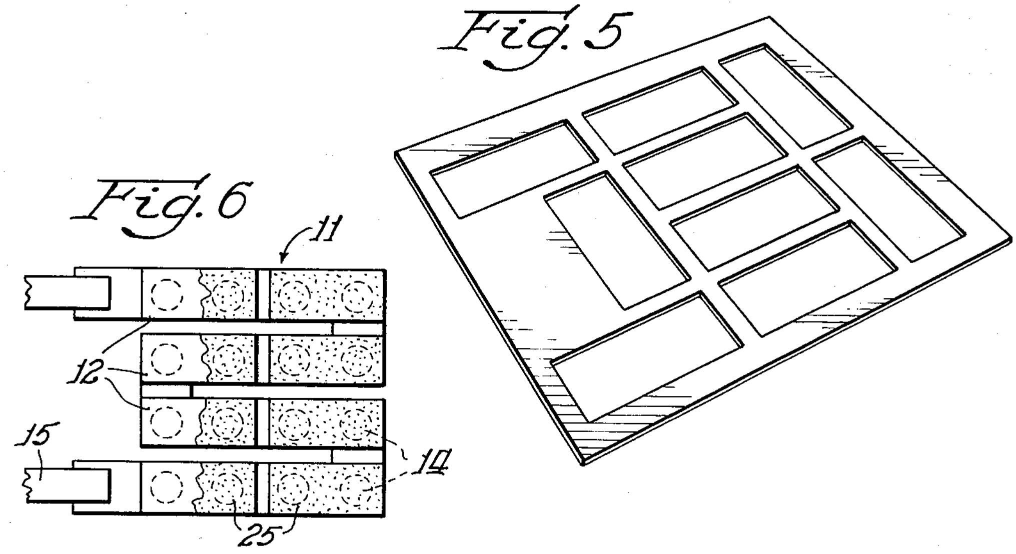
FIGURE 5 is a perspective view of a metallic stencil for use in spraying the circuit pattern shown in FIGURE 3.
FIGURE 6 is a view showing the cold side or cold junction of a thermoelectric module having bus bars which match the circuit pattern shown in FIGURE 2.
Figure 7:
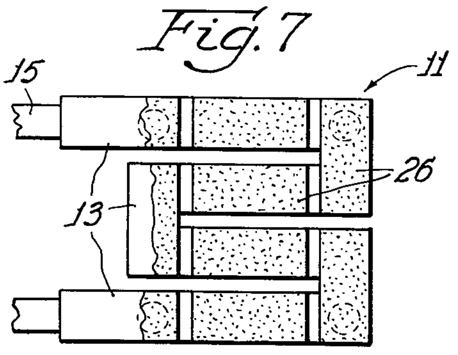
FIGURE 7 is a view of the hot side or hot junction of the thermoelectric module, FIGURE 6, which matches the circuit pattern shown in FIGURE 3.

The aluminum substrate 18, preferably, is roughened with a grit blast after which the aluminum oxide film 16 is sprayed thereon by means of a flame spray gun, such as a plasma gun, whereby a good mechanical interlocking is provided. Following this a solderable metal, such as copper, is applied by means of a flame spray gun in discrete areas so as to form a copper circuit pattern 21 by the use of the stencil shown in FIGURE 4. This copper circuit pattern 21 matches the pattern of the bus bars 12 of the module 11. The surfaces of the copper circuit pattern 21 and the bus bars 12 are then cleansed by suitable means, such as steel wool, so as to prepare the surfaces for easy tinning with the solder films 23 and 25, respectively. The same steps are then employed with respect to the copper circuit pattern 22 and the bus bar pattern 13. These copper circuit patterns 21 and 22 are then assembled in alignment with their respective bus bars 12 and 13. Pressure is then applied together with heating to the melting point of the solder which completes the assembly, comprising a module interconnected between a pair of heat exchangers that are separated dielectrically by the aluminum oxide films 16 and 17 which have good thermal conductivity, thereby providing a heat pump shown in FIGURE 1. Both of the substrata may be provided with fins depending on the manner in which the heat pump is to be used.

It is contemplated that a heat pump built in accordance with the present invention will comprise a multiplicity of modules, the number depending upon the requirements of the area to be served and the desired heat pumping capacity. Further, it should be understood that the number of couples in each unit may vary from the number in the embodiment disclosed in this application, which consists of 8 couples.

While this invention has been described in connection with a certain specific embodiment thereof, it is to be understood that it is by way of illustration only and not by way of limitation, and the scope of this invention is defined solely by the appended claims which should be construed as broadly as the prior art will permit.

We claim:

1. A method of making a heat pump including the steps of providing a thermoelectric module having hot junctions and cold junctions comprising bus bars, tinning the faces of said bus bars with a film of solder, providing a pair of aluminum base plates one each to be connected to said hot and cold junctions, the one of said pair of base plates to be connected to said hot junctions being provided with fins, flame spraying the faces of said pair of base plates that are to be connected to said hot and cold junctions with an aluminum oxide film, flame spraying a copper-circuit on the aluminum oxide film of the said base plates in the form of patterns to match the patterns of the said bus bars to which the respective ones of said base plates are to be attached, tinning said copper circuits with a film of solder, assembling said base plates on opposite sides of said module in a manner so that the said copper circuits of the respective said base plates match and are in alignment with said bus bar patterns, and applying pressure and heat to a degree whereby a union is effected.

2. A method of making a heat pump according to claim 1 and including using stencils in flame spraying the said copper circuits.

References Cited by the Examiner

UNITED STATES PATENTS

| | | | |
|---|---|---|---|
| 2,773,239 | 12/1956 | Parker | 29—155.5 |
| 3,075,360 | 1/1963 | Elfving et al. | 29—155.5 |
| 3,110,100 | 11/1963 | Hill | 29—155.5 |

FOREIGN PATENTS

| | | |
|---|---|---|
| 587,490 | 4/1947 | Great Britain. |
| 824,347 | 11/1959 | Great Britain. |

OTHER REFERENCES

NBS Publication No. 192; Nov. 22, 1948, pp. 42—44.

WHITMORE A. WILTZ, *Primary Examiner.*